United States Patent
Tavkhelidze et al.

(10) Patent No.: US 8,330,192 B2
(45) Date of Patent: Dec. 11, 2012

(54) METHOD FOR MODIFICATION OF BUILT IN POTENTIAL OF DIODES

(75) Inventors: Avto Tavkhelidze, Tbilisi (GE); Amiran Bibilashvili, Tbilisi (GE); Rodney T. Cox, North Plains, OR (US)

(73) Assignee: Borealis Technical Limited (GI)

( * ) Notice: Subject to any disclaimer, the term of this patent is extended or adjusted under 35 U.S.C. 154(b) by 511 days.

(21) Appl. No.: 11/883,011

(22) PCT Filed: Jan. 24, 2006

(86) PCT No.: PCT/US2006/002541
§ 371 (c)(1),
(2), (4) Date: Jul. 24, 2007

(87) PCT Pub. No.: WO2006/079084
PCT Pub. Date: Jul. 27, 2006

(65) Prior Publication Data
US 2009/0121254 A1    May 14, 2009

(30) Foreign Application Priority Data

Jan. 24, 2005 (GB) .................................. 0501413.9

(51) Int. Cl.
*H01L 29/80* (2006.01)
(52) U.S. Cl. ... 257/280; 257/96; 257/185; 257/E29.012; 257/E29.025
(58) Field of Classification Search ............... 257/94–96, 257/185, 280, 471, E29.005, E29.12, E29.024, 257/E29.025, E29.012
See application file for complete search history.

(56) References Cited

U.S. PATENT DOCUMENTS

| | | | |
|---|---|---|---|
| 3,740,592 A | 6/1973 | Engdahl et al. | |
| 4,011,582 A | 3/1977 | Cline et al. | |
| 4,039,352 A | 8/1977 | Marinescu | |
| 4,063,965 A | 12/1977 | Cline et al. | |
| 4,686,162 A | 8/1987 | Stangl et al. | |
| 5,023,671 A | 6/1991 | DiVincenzo et al. | |
| 5,068,535 A | 11/1991 | Rabalais | |
| 5,119,151 A * | 6/1992 | Onda | 257/14 |
| 5,229,320 A | 7/1993 | Ugajin | |
| 5,233,205 A | 8/1993 | Usagawa et al. | |
| 5,247,223 A | 9/1993 | Mori et al. | |
| 5,298,108 A * | 3/1994 | Miller | 148/33.4 |
| 5,332,952 A | 7/1994 | Ugajin et al. | |
| 5,336,547 A | 8/1994 | Kawakita et al. | |
| 5,371,388 A | 12/1994 | Oda | |

(Continued)

FOREIGN PATENT DOCUMENTS

DE    3404137 A1    8/1985

(Continued)

OTHER PUBLICATIONS

Chou et al., "Imprint Lithography with 25 Nanometer Resolution", Science, Apr. 5, 1996, pp. 85-87, vol. 272.

(Continued)

*Primary Examiner* — Matthew E Warren

(57) ABSTRACT

In broad terms the present invention is a semiconductor junction comprising a first material (102) and a second material (104), in which a surface of one or both of the junction materials has a periodically repeating structure that causes electron wave interference resulting in a change in the way electron energy levels within the junction are distributed.

18 Claims, 1 Drawing Sheet

106   104   102

U.S. PATENT DOCUMENTS

| | | | |
|---|---|---|---|
| 5,432,362 A | 7/1995 | Lippens et al. | |
| 5,503,963 A | 4/1996 | Bifano | |
| 5,521,735 A | 5/1996 | Shimizu et al. | |
| 5,579,232 A | 11/1996 | Tong et al. | |
| 5,604,357 A | 2/1997 | Hori | |
| 5,654,557 A | 8/1997 | Taneya et al. | |
| 5,675,972 A | 10/1997 | Edelson | |
| 5,699,668 A | 12/1997 | Cox | |
| 5,705,321 A | 1/1998 | Brueck et al. | |
| 5,719,407 A | 2/1998 | Ugajin | |
| 5,722,242 A | 3/1998 | Edelson | |
| 5,772,905 A | 6/1998 | Chou | |
| 5,917,156 A | 6/1999 | Nobori et al. | |
| 6,117,344 A | 9/2000 | Cox et al. | |
| 6,214,651 B1 | 4/2001 | Cox | |
| 6,225,205 B1 | 5/2001 | Kinoshita | |
| 6,281,514 B1 | 8/2001 | Tavkhelidze | |
| 6,309,580 B1 | 10/2001 | Chou | |
| 6,417,060 B2 | 7/2002 | Tavkhelidze et al. | |
| 6,495,843 B1 | 12/2002 | Tavkhelidze et al. | |
| 6,531,703 B1 | 3/2003 | Tavkhelidze et al. | |
| 6,680,214 B1 | 1/2004 | Tavkhelidze et al. | |
| 6,891,191 B2 * | 5/2005 | Xiao et al. | 257/40 |
| 7,027,277 B1 * | 4/2006 | Vashchenko et al. | 361/56 |
| 7,085,443 B1 * | 8/2006 | Gunn et al. | 385/14 |
| 7,166,786 B2 | 1/2007 | Tavkhelidze et al. | |
| 2001/0046749 A1 | 11/2001 | Tavkhelidze et al. | |
| 2003/0068431 A1 | 4/2003 | Taliashvili et al. | |
| 2003/0221608 A1 | 12/2003 | Mori | |
| 2004/0174596 A1 | 9/2004 | Umeki | |

FOREIGN PATENT DOCUMENTS

| | | |
|---|---|---|
| DE | 3818192 A1 | 12/1989 |
| EP | 0 437 654 A1 | 7/1991 |
| JP | 03155376 A | 7/1991 |
| JP | 4080964 A | 3/1992 |
| JP | 05226704 A | 9/1993 |
| WO | WO 99/13562 A1 | 3/1999 |
| WO | WO 99/64642 A | 12/1999 |
| WO | WO 00/59047 A | 10/2000 |
| WO | WO 02/47178 A | 6/2002 |
| WO | WO 03/083177 | 10/2003 |

OTHER PUBLICATIONS

Sungtaek Ju et al., "Study of interface effects in thermoelectric microfefrigerators", Journal of Applied Physics, Oct. 1, 2000, pp. 4135-4139, vol. 88, No. 7.

Hishinuma et al., "Refrigeration by combined tunneling and thermionic emmission in vacuum: Use of nanometer scale design", Appl Phys Lett, Apr. 23, 2001, pp. 2572-2574, vol. 78, No. 17.

Leon N. Cooper, "Bound Electron Pairs in Degenerate Fermi Gas", Physical Review, Nov. 15, 1956, pp. 1189-1190, vol. 104, No. 4.

Bardeen et al., "Theory of Superconductivity", Physical Review, Dec. 1, 1957, pp. 1175-1204, vol. 108, No. 5.

* cited by examiner 106  104  102

METHOD FOR MODIFICATION OF BUILT IN POTENTIAL OF DIODES

CROSS-REFERENCE TO RELATED APPLICATIONS

This application is the U.S. national stage application of International Application No. PCT/US2006/002541, filed Jan. 24, 2006, which international application was published on Jul. 27, 2006, as International Publication WO/2006/079084 in the English language. The International Application claims the benefit of GB Patent Application No. GB0501413.9, filed Jan. 24, 2005. This application is also a continuation-in-part application of application Ser. No. 10/991,257 filed Nov. 16, 2004, which application is a continuation-in-part application of application Ser. No. 10/508,914 filed Sep. 22, 2004, which is a U.S. national stage application of International Application PCT/US03/08907, filed Mar. 24, 2003, which international application was published on Oct. 9, 2003, as International Publication W003083177 in the English language. The International Application claims the benefit of U.S. Provisional Application No. 60/366,563, filed Mar. 22, 2002, U.S. Provisional Application No. 60/366,564, filed Mar. 22, 2002, and U.S. Provisional Application No. 60/373,508, filed Apr. 17, 2002. application Ser. No. 10/991,257 is also a continuation-in-part application of application Ser. No. 10/760,697 filed Jan. 19, 2004, now U.S. Pat. No. 7,166,786, which is a divisional application of application Ser. No. 09/634,615, filed Aug. 5, 2000, now U.S. Pat. No. 6,680,214, which claims the benefit of U.S. Provisional Application No. 60/149,805, filed on Aug. 18, 1999, and is a continuation application of application Ser. No. 09/093,652, filed Jun. 8, 1998, now abandoned, and is related to application Ser. No. 09/020,654, filed Feb. 9, 1998, now U.S. Pat. No. 6,281,514. This application is also a continuation-in-part application of application Ser. No. 10/531,367 filed Apr. 13, 2005, which application is the U.S. national stage application of International Application PCT/IB2003/006480, filed Oct. 20, 2003, which international application was published on May 13, 2004, as International Publication W02004/040617 in the English language. The International Application claims the benefit of U.K. Application No. GB0224300.4, filed Oct. 20, 2002. Application Ser. No. 10/531,367 is a continuation in part of U.S. patent application Ser. No. 10/508,914, which is the U.S. national stage application of International Application PCT/US03/08907, filed Mar. 24, 2003, which international application was published on Oct. 9, 2003, as International Publication W003083177 in the English language. The International Application claims the benefit of U.S. Provisional Application No. 60/366,563, filed Mar. 22, 2002, U.S. Provisional Application No. 60/366,564, filed Mar. 22, 2002, and U.S. Provisional Application No. 60/373,508, filed Apr. 17, 2002. The International Application is related to co-pending U.S. patent application Ser. No. 10/234,498, filed 3 Sep. 2002, which claims the benefit of U.S. Provisional Application No. 60/316,918, filed 2 Sep. 2001. The above-mentioned patent applications are assigned to the assignee of the present application and are herein incorporated in their entirety by reference.

The above-mentioned patent applications are assigned to the assignee of the present application and are herein incorporated in their entirety by reference.

U.S. Pat. No. 6,680,214 and U.S. Pat. No. 7,166,786 disclose methods for the induction of a suitable band gap and electron emissive properties into a substance, in which the substrate is provided with a surface structure corresponding to the interference of electron waves. Lithographic or similar techniques are used, either directly onto a metal mounted on the substrate, or onto a mold which then is used to impress the metal. In a preferred embodiment, a trench or series of nano-sized trenches are formed in the metal.

TECHNICAL FIELD

The present invention relates to diode devices.

BACKGROUND ART

The behaviour of semiconductor devices depends chiefly on the physics of band alignment (more precisely band offsets in semiconductor—semiconductor heterojunctions and Schottky barriers at metal—semiconductor contact) and existence of interface states.

Semiconductor heterojunctions were proposed as a way of increasing amplification and achieving higher frequencies and power. Such a heterostructure consists of two semiconductors whose atomic structures fit one another well, but which have different electronic properties. Semiconductor heterostructures have been at least equally important to the development of photonics—lasers, light emitting diodes, modulators and solar panels, to mention a few examples. The semiconductor laser is based upon the recombination of electrons and holes, emitting particles of light, photons. The concentration of electrons, holes and photons becomes much higher if they are confined to a thin semiconductor layer between two others —a double heterojunction.

Metal-to-semiconductor junctions are of great importance since they are present in every semiconductor device. They can behave either as a Schottky barrier or as an ohmic contact dependent on the characteristics of the interface. Other junctions that have a significant impact on the performance of a device include metal oxide—semiconductor junctions, such as MOSFET.

The ability to tune the barrier height/band-offset is strongly desirable. For example, the contact resistance to a semiconductor can be dramatically improved with a reduction in its Schottky barrier height. The ohmic contact issue is particularly relevant for wide band gap semiconductors with doping difficulties, such as the p-type GaN. Another interface where the ability to tune the Schottky barrier height is beneficial is between high permittivity (high-K) gate dielectrics and metal gates, which is an important element of next-generation ULSI devices. In addition, metal gates help to keep the crucial effective oxide thickness (EOT) small by avoiding reaction with the high-k dielectric and thereby obviating the need for a (lower-k) buffer layer. One philosophy for metal gate is to choose a metal with a work function that matches roughly the mid-gap point of the semiconductor. However, to be able to maintain the threshold gate voltage for the field effect transistor at a convenient voltage, especially at scaled-back power supply voltages, it is desirable to have separate Fermi level positions for the gates on n-type and p-type channels. For this purpose, one needs to control the Schottky barrier height (SBH) between the metal gate and the high-K dielectric. The most successful approaches to modify the SBH has been to insert a very thin layer of material between the metal and the semiconductor. For example, layers of insulators, semiconductors, molecular dipoles, and chemical passivation, formed on the semiconductor surface, have been shown to modify the barrier height of Schottky contact. The manner by which the SBH is affected by the interlayer is rather unpredictable and system-specific.

U.S. Pat. Nos. 6,281,514, 6,495,843, and 6,531,703 disclose methods for promoting the passage of electrons at or through a potential barrier comprising providing a potential barrier having a geometrical shape for causing de Broglie interference between electrons. In another embodiment, the invention provides an electron-emitting surface having a series of indents. The depth of the indents is chosen so that the probability wave of the electron reflected from the bottom of the indent interferes destructively with the probability wave of the electron reflected from the surface. This results in the increase of tunneling through the potential barrier. In further embodiments, the invention provides vacuum diode devices, including a vacuum diode heat pump, a thermionic converter and a photoelectric converter, in which either or both of the electrodes in these devices utilize said electron-emitting surface. In yet further embodiments, devices are provided in which the separation of the surfaces in such devices is controlled by piezo-electric positioning elements. A further embodiment provides a method for making an electron-emitting surface having a series of indents.

U.S. Pat. No. 6,680,214 and U.S. Pat. App. No. 2004/0206881 disclose methods for the induction of a suitable band gap and electron emissive properties into a substance, in which the substrate is provided with a surface structure corresponding to the interference of electron waves. Lithographic or similar techniques are used, either directly onto a metal mounted on the substrate, or onto a mold which then is used to impress the metal. In a preferred embodiment, a trench or series of nano-sized trenches are formed in the metal.

U.S. Pat. No. 6,117,344 discloses methods for fabricating nano-structured surfaces having geometries in which the passage of electrons through a potential barrier is enhanced. The methods use combinations of electron beam lithography, lift-off, and rolling, imprinting or stamping processes.

WO9964642 discloses a method for fabricating nanostructures directly in a material film, preferably a metal film, deposited on a substrate. In a preferred embodiment a mold or stamp having a surface which is the topological opposite of the nanostructure to be created is pressed into a heated metal coated on a substrate. The film is cooled and the mold is removed. In another embodiment, the thin layer of metal remaining attached to the substrate is removed using bombardment with a charged particle beam.

WO03083177 teaches that a metal surface can be modified with patterned indents to increase the Fermi energy level inside the metal, leading to decrease in electron work function. This effect would exist in any quantum system comprising fermions inside a potential energy box.

WO04040617 offers a method which blocks movement of low energy electrons through a thermoelectric material. This is achieved using a filter which is more transparent to high energy electrons than to low energy ones. Tunnel barrier on the path of the electrons is used as filter. The filter works on the basis of the wave properties of the electrons. The geometry of the tunnel barrier is such that the barrier becomes transparent for electrons having certain de Broglie wavelength. If the geometry of the barrier is such that its transparency wavelength matches the wavelength of high energy electrons it will be transparent for high energy electrons and will be blocking low energy ones by means of tunnel barrier.

DISCLOSURE OF INVENTION

The present invention extends our previous work to new junction designs for electronic devices.

In broad terms the present invention is a semiconductor/semiconductor or Metal/Semiconductor junction comprising a first material and a second material, in which a surface of one or both of the junction materials has a periodically repeating structure that causes electron wave interference resulting in a change in the way electron energy levels within the junction are distributed.

BRIEF DESCRIPTION OF DRAWINGS

For a more complete explanation of the present invention and the technical advantages thereof, reference is now made to the following description and the accompanying drawing in which.

BEST MODE FOR CARRYING OUT THE INVENTION

Figure 1:
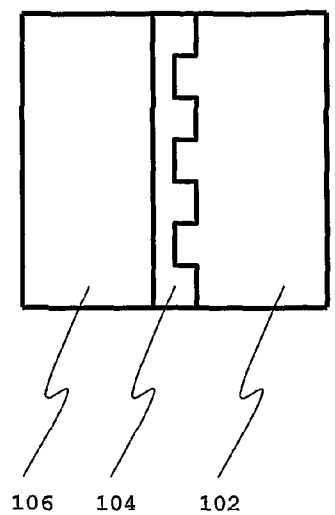
FIG. 1 shows in a schematic fashion a junction of the present invention.

Embodiments of the present invention and their technical advantages may be better understood by referring to FIG. 1.

Figure 2:
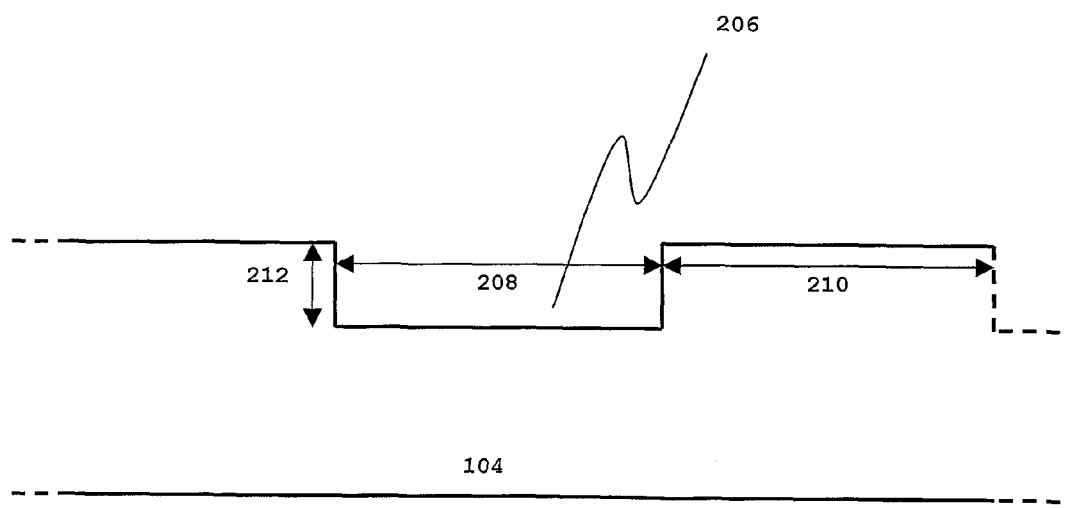
FIG. 2 shows in a schematic fashion the nature of the periodic repeating structure.

Referring now to FIG. 1, which shows a simple representation of a junction of the present invention, a first component 102 of the junction is in contact with a second component 104. Component 104 has a surface that has a periodic repeating structure, as shown in FIG. 2. Indent 206 has a width 208 and a depth 212 and the separation between the indents is 210. Preferably distances 208 and 210 are substantially equal. Preferably distance 208 is of the order of 2 μm or less. Experimental observations using a Kelvin probe indicate that the magnitude of a reduction in an apparent work function increases as distance 212 is reduced. Utilization of e-beam lithography to create structures of the kind shown in FIG. 2 may allow indents to be formed in which distance 208 is 200 nm or less. Distance 212 is of the order of 20 nm or less, and is preferably of the order of 5 nm.

The dimensions of the repeating structure are such that the probability wave of an electron reflected from the bottom of an indent of the periodic structure interferes destructively with the probability wave of an electron reflected from the surface. This leads to a change in work function, and consequently in built in potential of the junction. This leads to change in the opening voltage and the breakdown voltage of the junction, resulting in a junction with predefined properties. The configuration of the surface may resemble a corrugated pattern of squared-off, "u"-shaped ridges and/or valleys. Alternatively, the pattern may be a regular pattern of rectangular "plateaus" or "holes," where the pattern resembles a checkerboard. The walls of said indents should be substantially perpendicular to one another, and the edges of the indents should be substantially sharp. Further, one of ordinary skill in the art will recognize that other configurations are possible that may produce the desired interference of wave function of electron. The surface configuration may be achieved using conventional approaches known in the art, including without limitation lithography and e-beam milling.

In FIG. 1, component 104 may be a metal or a semiconductor. Component 102 may be a semiconductor or a metal when component 104 is a semiconductor, and is a semiconductor when component 104 is a metal. In addition, the metal may also comprise its oxide.

Component 102 may be fabricated by methods disclosed in our previous disclosures, or by other approaches known to the art.

The structure shown in FIG. 1 may additionally comprise a third material 106, which may be a metal or a semiconductor.

Table 1 below shows the variations and combinations of junction materials that fall within the scope of the present invention.

TABLE 1 variations and combinations of junction materials
(M is metal; SC is semiconductor)
Junction Material (FIG. 1)

| 104 | 102 | 106 |
|-----|-----|-----|
| M | M | SC |
| M | SC | SC |
| M | SC | M |
| SC | M | M |
| SC | M | SC |
| SC | SC | SC |
| SC | SC | M |
| M | SC | Not Present |
| SC | M | Not Present |
| SC | SC | Not Present |

INDUSTRIAL APPLICABILITY

The present invention results in a change in the built in potential of the junction (both in p-n and Schottky case). This leads to a change in the opening voltage and breakdown voltage of the junction, and it allows a junction with pre-defined parameters to be fabricated. Such junctions are applicable in the fields of:
1. p-n diodes including: Bipolar transistors, Photodiodes, Solar batteries.
2. Schottky diodes including: Schottky transistors, Ohmic contacts.
3. optical heterostructures including: Light diodes, Semiconductor Lasers.

The invention claimed is:

1. A semiconductor junction comprising:
   a first material comprising a metal or a semiconductor; and
   a second material, the second material in contact with the first material and wherein said second material comprises a semiconductor;
   in which a surface of said second material has a periodically repeating structure configured to cause electron wave interference formed with a plurality of indents with dimensions selected to reflect a probability wave of an electron from a bottom of an indent so that said wave interferes destructively with a probability wave of an electron reflected from a surface, wherein each said indent has a depth selected to increase apparent electron work function, wherein the depth of each said indent is less than approximately 10 nm and the width of each said indent is less than approximately 1 μm, thereby causing built in potential of said junction to change with a change in work function.

2. The semiconductor junction of claim 1 in which said depth is approximately 5 nm.

3. The semiconductor junction of claim 1 in which said width is less than approximately 100 nm.

4. The semiconductor junction of claim 1 wherein said first material is a metal.

5. The semiconductor junction of claim 1 wherein said first material is a semiconductor.

6. A semiconductor device comprising one or more semiconductor junctions of claim 1.

7. A p-n diode comprising one or more semiconductor junctions of claim 1.

8. The p-n diode of claim 7 selected from the group consisting of: bipolar transistors, photodiodes, and solar batteries.

9. A Schottky diode comprising one or more semiconductor junctions of claim 1.

10. The Schottky diode of claim 9 selected from the group consisting of:
    Schottky transistors and Ohmic contacts.

11. An optical heterostructure comprising one or more semiconductor junctions of claim 1.

12. The optical heterostructure of claim 11 selected from the group consisting of: light diodes and semiconductor lasers.

13. The semiconductor junction of claim 1 in which said plurality of indents are formed in the surface of the second material.

14. The semiconductor junction of claim 1 in which a surface of said second material opposite said surface having said plurality of indents is in contact with a surface of said first material.

15. A semiconductor junction for electronic devices comprising:
    a. a first component formed of a first material comprising a metal or a semiconductor;
    b. a second component in contact with said first component and formed of a second material comprising a semiconductor or a metal, wherein the material of said second component is selected to be a semiconductor when said first material is metal and to be a metal when said first material is a semiconductor; and
    c. a surface of one or both of said first component material or said second component material has a periodically repeating structure configured to cause electron wave interference, said periodically repeating structure comprising a plurality of indents with dimensions selected to reflect a probability wave of an electron from a bottom of an indent so that said wave interferes destructively with a probability wave of an electron reflected from a surface, wherein each said indent has a depth selected to increase apparent electron work function, and the depth of each said indent is less than approximately 10 nm and the width of each said indent is less than approximately 1 μm, thereby causing built in potential of said junction to change with a change in electron work function.

16. The semiconductor junction of claim 15, further including a third component contacting said second component, wherein said third component is formed of a material comprising a metal or a semiconductor.

17. The semiconductor junction of claim 15 in which the depth of said indent is approximately 5 nm.

18. The semiconductor junction of claim 15 in which the width of said indent is less than approximately 100 nm.

* * * * *